US00RE41576E

(19) United States
(12) Reissued Patent
Bunyan et al.

(10) Patent Number: US RE41,576 E
(45) Date of Reissued Patent: Aug. 24, 2010

(54) CONFORMAL THERMAL INTERFACE MATERIAL FOR ELECTRONIC COMPONENTS

(75) Inventors: Michael H. Bunyan, Chelmsford, MA (US); Miksa deSorgo, Lago Vista, TX (US)

(73) Assignee: Parker-Hannifin Corporation, Cleveland, OH (US)

(21) Appl. No.: 09/714,680

(22) Filed: Nov. 16, 2000

Related U.S. Patent Documents

Reissue of:
(64) Patent No.: 6,054,198
Issued: Apr. 25, 2000
Appl. No.: 08/801,047
Filed: Feb. 14, 1997

U.S. Applications:
(60) Provisional application No. 60/016,488, filed on Apr. 29, 1996.

(51) Int. Cl.

| | |
|---|---|
| ***B32B 9/00*** | (2006.01) |
| ***B32B 33/00*** | (2006.01) |
| ***B32B 27/32*** | (2006.01) |
| ***B32B 27/08*** | (2006.01) |
| ***C09J 5/02*** | (2006.01) |
| ***F28F 7/00*** | (2006.01) |

(52) U.S. Cl. ..... 428/515; 428/40.5; 428/41.3; 428/41.8; 428/220; 428/348; 428/349; 156/324.4; 165/185

(58) Field of Classification Search ..... 165/185, 165/DIG. 44; 428/40.5, 41.3, 41.8, 220, 348, 428/349, 515; 156/247, 306.6, 324.4
See application file for complete search history.

(56) References Cited

U.S. PATENT DOCUMENTS

| | | | | | |
|---|---|---|---|---|---|
| 2,311,526 | A | * | 2/1943 | Ferguson et al. | 524/62 |
| 3,332,055 | A | * | 7/1967 | Bogner | 439/88 |
| 3,609,104 | A | * | 9/1971 | Ehrreich et al. | 252/511 |
| 3,928,907 | A | | 12/1975 | Chisholm | |
| 4,299,715 | A | * | 11/1981 | Whitfield et al. | 252/74 |
| 4,384,610 | A | * | 5/1983 | Cook et al. | 165/80.2 |
| 4,389,340 | A | * | 6/1983 | Levy | 252/512 |
| 4,466,483 | A | * | 8/1984 | Whitfield et al. | 165/185 |
| 4,473,113 | A | * | 9/1984 | Whitfield et al. | 165/185 |
| 4,487,856 | A | * | 12/1984 | Anderson et al. | 523/205 |
| 4,533,685 | A | * | 8/1985 | Hudgin et al. | 523/457 |
| 4,546,411 | A | * | 10/1985 | Kaufman | 361/705 |
| 4,561,011 | A | * | 12/1985 | Kohara et al. | 257/713 |
| 4,575,432 | A | * | 3/1986 | Lin et al. | 252/511 |
| 4,602,678 | A | | 7/1986 | Fick | |
| 4,654,754 | A | | 3/1987 | Daszkowski | |
| 4,685,987 | A | | 8/1987 | Fick | |
| 4,722,960 | A | * | 2/1988 | Dunn et al. | 524/430 |
| 4,755,249 | A | * | 7/1988 | DeGree et al. | 156/252 |
| 4,764,845 | A | * | 8/1988 | Artus | 361/705 |
| 4,782,893 | A | * | 11/1988 | Thomas | 165/185 |
| 4,842,911 | A | | 6/1989 | Fick | |
| 4,855,002 | A | * | 8/1989 | Dunn et al. | 156/307.3 |
| 5,798,171 | A | | 8/1989 | Olson | 428/220 |
| 4,869,954 | A | | 9/1989 | Squitieri | |
| 4,915,167 | A | | 4/1990 | Altoz | 165/185 |
| 4,965,699 | A | | 10/1990 | Jordan et al. | 361/387 |
| 4,974,119 | A | | 11/1990 | Martin | 361/386 |
| 4,979,074 | A | | 12/1990 | Morley et al. | 361/386 |
| 5,052,481 | A | | 10/1991 | Horvath et al. | 165/185 |
| 5,060,114 | A | | 10/1991 | Feinberg et al. | |
| 5,061,549 | A | | 10/1991 | Shores | |
| 5,137,959 | A | | 8/1992 | Block et al. | 524/430 |
| 5,167,851 | A | | 12/1992 | Jamison et al. | |
| 5,194,480 | A | | 3/1993 | Block et al. | 524/404 |
| 5,213,868 | A | | 5/1993 | Liberty et al. | 428/131 |
| 5,250,209 | A | | 10/1993 | Jamison et al. | |
| 5,298,791 | A | | 3/1994 | Liberty et al. | 257/707 |
| 5,302,344 | A | | 4/1994 | Perlman | 422/26 |
| 5,321,882 | A | | 6/1994 | Casperson | 361/713 |
| 5,352,731 | A | | 10/1994 | Nakamo et al. | 524/786 |
| 5,372,883 | A | | 12/1994 | Shores | |
| 5,471,027 | A | | 11/1995 | Call et al. | |
| 5,533,256 | A | | 7/1996 | Call et al. | |
| 5,545,473 | A | | 8/1996 | Ameen et al. | |
| 5,602,221 | A | | 2/1997 | Bennett et al. | 526/307.7 |
| 5,679,457 | A | | 10/1997 | Bergerson | |
| 5,770,318 | A | | 6/1998 | Friedman | 428/500 |
| 5,781,412 | A | | 7/1998 | de Sorgo | |
| 5,796,582 | A | | 8/1998 | Katchmar | 361/704 |
| 5,930,893 | A | | 8/1999 | Eaton | |
| 6,391,442 | B1 | | 5/2002 | Duvall et al. | |

FOREIGN PATENT DOCUMENTS

| | | |
|---|---|---|
| JP | 5138396 | 9/1993 |

OTHER PUBLICATIONS

Advances in Electronic Packaging 1995. Proceedings of the International Intersociety Electronic Packaging Conference—Interpack '95, vol. 2, 1995.*

IBM Technical Disclosure Bulletin, vol. 25, No. 11A, Apr. 1983.*

Electronic Packaging and Production, vol. 35, No. 10, Sep. 1, 1995.*

IBM Technical Disclosure Bulletin, vol. 35, No. 7, Dec. 1, 1992.*

IBM Technical Disclosure Bulletin, vol. 24, No. 12, May 1982.*

(Continued)

*Primary Examiner*—Sheeba Ahmed
(74) *Attorney, Agent, or Firm*—John A. Molnar, Jr.

(57) ABSTRACT

A thermally-conductive interface for conductively cooling a heat-generating electronic component having an associated thermal dissipation member such as a heat sink. The interface is formed as a self-supporting layer of a thermally-conductive material which is form-stable at normal room temperature in a first phase and substantially conformable in a second phase to the interface surfaces of the electronic component and thermal dissipation member. The material has a transition temperature from the first phase to the second phase which is within the operating temperature range of the electronic component.

6 Claims, 1 Drawing Sheet

OTHER PUBLICATIONS

IBM Technical Disclosure Bulletin, vol. 23, No. 6, dated Nov. 1980.*
IBM Technical Disclosure Bulletin, vol. 27, No. 7A, dated Dec. 1984.*
Aldrich Chemical Catalog, Milwaukee, WI, p. T330, 1994.*
International Application Published Under the Patent Cooperation Treaty in International Publication No. WO96/37915; published Nov. 28, 1996.
Article entitled Thermally Conductive Adhesives for Electronic Packaging, authored by Carol Latham, President of Thermagon, Inc. dated Jul. 1991.
Technical Data Sheet Ablefilm® 5025E, dated Mar. 1992 of Ablestik, entitled Electrically Conductive Adhesive Flm.
Technical Data Sheet Ablefilm® 563K, dated Nov. 1995 of Ablestik, entitled Thermally Conductive Adhesiv Film.
Technical Data Sheet Ablefilm® 566K, dated Nov. 1995 of Ablestik, entitled Low Temperature Cure Adhesiv Film.
Article entitled T–gon 100 Series, Thermally Conductive Epoxy Adhesive Films, dated Jun. 10, 1997 of Thermagon, Inc.
AI Technology Data Sheet for Cool–Pad TP7015, revised Feb. 1992.
AI Technology Data Sheet for Cool–Pad TP7608, revised Feb. 1992.
AI Technology Data Sheet for Cool–Pad TP7208, revised Feb. 1992.
AI Technology Data Sheet for Cool–Paid TP7205, revised Feb., 192.
AI Technology Data Sheet for Thermoplastic TP7165, revised Oct. 1994.
AI Technology Data Sheet for Cool–Pad TP7605, revised Oct. 1994.
AI Technology Data Sheet for Cool–Pad TP7609, revised Aug. 12, 2000.
Article authored by L.M. Leung and K. K. T. Chung entitled Zero–stress Film Adhesive for Substrate Attach, published in Hybrid Circuits No. 18, Jan. 1989.
AI Technology Invoice No. 6420 dated Feb. 12, 1993.
AI Technology Invoice No. 7344 dated Aug. 27, 1993.
AI Technology Invoice No. 5657 dated Sep. 14, 1992.
AI Technology Invoice No. 4580 dated Mar. 24, 1993.
AI Technology Invoice No. 5370 dated Jul. 27, 1992.
AI Technology Invoice No. 4964 dated May 27, 1992.
AI Technology Invoice No. 8303 dated Mar. 18, 1994.
AI Technology Invoice No. 8789 dated Jul. 18, 1994.

* cited by examiner

CONFORMAL THERMAL INTERFACE MATERIAL FOR ELECTRONIC COMPONENTS

Matter enclosed in heavy brackets [ ] appears in the original patent but forms no part of this reissue specification; matter printed in italics indicates the additions made by reissue.

This application claims the benefit of U.S. Provisional Application No.: 60/016,488 filing date Apr. 29, 1996.

BACKGROUND OF THE INVENTION

The present invention relates broadly to a heat transfer material which is interposable between the thermal interfaces of a heat-generating, electronic component and a thermal dissipation member, such as a heat sink or circuit board, for the conductive cooling of the electronic component. More particularly, the invention relates to a self-supporting, form-stable film which melts or softens at a temperature or range within the operating temperature range of the electronic component to better conform to the thermal interfaces for improved heat transfer from the electronic component to the thermal dissipation member.

Circuit designs for modern electronic devices such as televisions, radios, computers, medical instruments, business machines, communications equipment, and the like have become increasingly complex. For example, integrated circuits have been manufactured for these and other devices which contain the equivalent of hundreds of thousands of transistors. Although the complexity of the designs has increased, the size of the devices has continued to shrink with improvements in the ability to manufacture smaller electronic components and to pack more of these components in an ever smaller area.

As electronic components have become smaller and more densely packed on integrated boards and chips, designers and manufacturers now are faced with the challenge of how to dissipate the heat which is ohmicly or otherwise generated by these components. Indeed, it is well known that many electronic components, and especially semiconductor components such as transistors and microprocessors, are more prone to failure or malfunction at high temperatures. Thus, the ability to dissipate heat often is a limiting factor on the performance of the component.

Electronic components within integrated circuit traditionally have been cooled via forced or convective circulation of air within the housing of the device. In this regard, cooling fins have been provided as an integral part of the component package or as separately attached thereto for increasing the surface area of the package exposed to convectively-developed air currents. Electric fans additionally have been employed to increase the volume of air which is circulated within the housing. For high power circuits and the smaller but more densely packed circuits typical of current electronic designs, however, simple air circulation often has been found to be insufficient to adequately cool the circuit components.

Heat dissipation beyond that which is attainable by simple air circulation may be effected by the direct mounting of the electronic component to a thermal dissipation member such as a "cold plate" or other heat sink. The heat sink may be a dedicated, thermally-conductive metal plate, or simply the chassis of the device. However, and as is described in U.S. Pat. No. 4,869,954, the faying thermal interface surfaces of the component and heat sink typically are irregular, either on a gross or a microscopic scale. When the interfaces surfaces are mated, pockets or void spaces are developed therebetween in which air may become entrapped. These pockets reduce the overall surface area contact within the interface which, in turn, reduces the efficiency of the heat transfer therethrough. Moreover, as it is well known that air is a relatively poor thermal conductor, the presence of air pockets within the interface reduces the rate of thermal transfer through the interface.

To improve the efficiency of the heat transfer through the interface, a layer of a thermally-conductive material typically is interposed between the heat sink and electronic component to fill in any surface irregularities and eliminate air pockets. Initially employed for this purpose were materials such as silicone grease or wax filled with a thermally-conductive filler such as aluminum oxide. Such materials usually are semi-liquid or sold at normal room temperature, but may liquefy or soften at elevated temperatures to flow and better conform to the irregularities of the interface surfaces.

For example, U.S. Pat. No. 4,299,715 discloses a wax-like, heat-conducting material which is combined with another heat-conducting material, such as a beryllium, zinc, or aluminum oxide powder, to form a mixture for completing a thermally-conductive path from a heated element to a heat sink. A preferred wax-like material is a mixture of ordinary petroleum jelly and a natural or synthetic wax, such as beeswax, palm wax, or mineral wax, which mixture melts or becomes plastic at a temperature above normal room temperature. The material can be excoriated or ablated by marking or rubbing, and adheres to the surface on which it was rubbed. In this regard, the material may be shaped into a rod, bar, or other extensible form which may be carried in a pencil-like dispenser for application.

U.S. Pat. No. 4,466,483 discloses a thermally-conductive, electrically-insulating gasket. The gasket includes a web or tape which is formed of a material which can be impregnated or loaded with an electronically-insulating, heat conducting material. The tape or web functions as a vehicle for holding the meltable material and heat conducting ingredient, if any, in a gasket-like form. For example, a central layer of a solid plastic material may be provided, both sides of which are coated with a meltable mixture of wax, zinc oxide, and a fire retardant.

U.S. Pat. No. 4,473,113 discloses a thermally-conductive, electrically-insulating sheet for application to the surface of an electronic apparatus. The sheet is provided as having a coating on each side thereof a material which changes state from a solid to a liquid within the operating temperature range of the electronic apparatus. The material may be formulated as a meltable mixture of wax and zinc oxide.

U.S. Pat. No. 4,764,845 discloses a thermally-cooled electronic assembly which includes a housing containing electronic components. A heat sink material fills the housing in direct contact with the electronic components for conducting heat therefrom. The heat sink material comprises a paste-like mixture of particulate microcrystalline material such as diamond, boron nitride, or sapphire, and a filler material such as a fluorocarbon or paraffin.

The greases and waxes of the aforementioned types heretofore known in the art, however, generally are not self-supporting or otherwise form stable at room temperature and are considered to be messy to apply to the interface surface of the heat sink or electronic component. To provide these materials in the form of a film which often is preferred for ease of handling, a substrate, web, or other carrier must be provided which introduces another interface layer in or between which additional air pockets may be formed. Moreover, use of such materials typically involves hand application or lay-up by the electronics assembler which increases manufacturing costs.

Alternatively, another approach is to substitute, a cured, sheet-like material for the silicone grease or wax material. Such materials may be compounded as containing one or more thermally-conductive particulate fillers dispersed within a polymeric binder, and may be provided in the form of cured sheets, tapes, pads, or films. Typical binder materials include silicones, urethanes, thermoplastic rubbers, and other elastomers, with typical fillers including aluminum oxide, magnesium oxide, zinc oxide, boron nitride, and aluminum nitride.

Exemplary of the aforesaid interface materials is an alumina or boron nitride-filled silicone or urethane elastomer which is marketed under the name CHO-THERM® by the Chomerics Division of Parker-Hannifin Corp., Woburn, Mass. Additionally, U.S. Pat. No. 4,869,954 discloses a cured, form-stable, sheet-like, thermally-conductive material for transferring thermal energy. The material is formed of a urethane binder, a curing agent, and one or more thermally conductive fillers. The fillers may include aluminum oxide, aluminum nitride, boron nitride, magnesium oxide, or zinc oxide.

U.S. Pat. No. 4,782,893 discloses a thermally-conductive, electrically-insulative pad for placement between an electronic component and its support frame. The pad is formed of a high dielectric strength material in which is dispersed diamond powder. In this regard, the diamond powder and a liquid phase of the high dielectric strength material may be mixed and then formed into a film and cured. After the film is formed, a thin layer thereof is removed by chemical etching or the like to expose the tips of the diamond particles. A thin boundary layer of copper or other metal then is bonded to the top and bottom surfaces of the film such that the exposed diamond tips extend into the surfaces to provide pure diamond heat transfer paths across the film. The pad may be joined to the electronic component and the frame with solder or an adhesive.

U.S. Pat. No. 4,965,699 discloses a printed circuit device which includes a memory chip mounted on a printed circuit card. The card is separated from an associated cold plate by a layer of a silicon elastomer which is applied to the surface of the cold plate.

U.S. Pat. No. 4,974,119 discloses a heat sink assembly which includes an electronic component supported on a printed circuit board in a spaced-apart relationship from a heat dispersive member. A thermally-conductive, elastomeric layer is interposed between the board and the electronic component. The elastomeric member may be formed of silicone and preferably includes a filler such as aluminum oxide or boron nitride.

U.S. Pat. No. 4,979,074 discloses a printed circuit board device which includes a circuit board which is separated from a thermally-conductive plate by a pre-molded sheet of silicone rubber. The sheet may be loaded with a filler such as alumina or boron nitride.

U.S. Pat. No. 5,137,959 discloses a thermally-conductive, electrically insulating interface material comprising a thermoplastic or cross linked elastomer filled with hexagonal boron nitride or alumina. The material may be formed as a mixture of the elastomer and filler, which mixture then may be cast or molded into a sheet or other form.

U.S. Pat. No. 5,194,480 discloses another thermally-conductive, electricallyinsulating filled elastomer. A preferred filler is hexagonal boron nitride. The filled elastomer may be formed into blocks, sheets, or films using conventional methods.

U.S. Pat. Nos. 5,213,868 and 5,298,791 disclose a thermally-conductive interface material formed of a polymeric binder and one or more thermally-conductive fillers. The fillers may be particulate solids, such as aluminum oxide, aluminum nitride, boron nitride, magnesium oxide, or zinc oxide. The material may be formed by casting or molding, and preferably is provided as a laminated acrylic pressure sensitive adhesive (PSA) tape. At least one surface of the tape is provided as having channels or through-holes formed therein for the removal of air from between that surface and the surface of a substrate such as a heat sink or an electronic component.

U.S. Pat. No. 5,321,582 discloses an electronic component heat sink assembly which includes a thermally-conductive laminate formed of polyamide which underlies a layer of a boron nitride-filled silicone. The laminate is interposed between the electronic component and the housing of the assembly.

Sheet-like materials of the above-described types have garnered general acceptance for use as interface materials in conductively-cooled electronic component assemblies. For some applications, however, heavy fastening elements such as springs, clamps, and the like are required to apply enough force to conform these materials to the interface surfaces to attain enough surface for efficient thermal transfer. Indeed, for certain applications, materials such as greases and waxes which liquefy, melt, or soften at elevated temperature sometimes as preferred as better conforming to the interface surfaces. It therefore will be appreciated that further improvements in these types of interface materials and methods of applying the same would be well-received by the electronics industry. Especially desired would be a thermal interface material which is self-supporting and form-stable at room temperature, but which is softenable or meltable at temperatures within the operating temperature range of the electronic component to better conform to the interface surfaces.

BROAD STATEMENT OF THE INVENTION

The present invention is directed to a heat transfer material which is interposable between the thermal interfaces of a heat-generating, electronic component and a thermal dissipation member. The material is of the type which melts or softens at a temperature or range within the operating temperature range of the electronic component to better conform to the thermal interfaces for improved heat transfer from the electronic component to the thermal dissipation member. Unlike the greases or waxes of such type heretofore known in the art, however, the interface material of the present invention is form-stable and self-supporting at room temperature. Accordingly, the material may be formed into a film or tape which may be applied using automated equipment to, for example, the interface surface of a thermal dissipation member such as a heat sink. In being self-supporting, no web or substrate need be provided which would introduce another layer into the interface between which additional air pockets could be formed.

It therefore is a feature of the present invention to provide for the conductive cooling a heat-generating electronic component. The component has an operating temperature range above normal room temperature and a first heat transfer surface disposable in thermal adjacency with a second heat transfer surface of an associated thermal dissipation member to define an interface therebetween. A thermally-conductive material is provided which is form-stable at normal room temperature in a first phase and conformable in a second phase to substantially fill the interface. The material, which has a transition temperature from the first phase to the second phase within the operating temperature range of the electronic component, is formed into a self-supporting layer. The layer is applied to one of the heat transfer surfaces, which surfaces then are disposed in thermal adjacency to define the interface. The energization of the electronic component is effective to heat the layer to a temperature which is above the phase transition temperature.

It is a further feature of the invention to provide a thermally-conductive interface for conductively cooling a heat-generating electronic component having an associated thermal dissipation member such as a heat sink. The interface is formed as a self-supporting mono-layer of a thermally-conductive material which is form-stable at normal room temperature in a first phase and substantially conformable in a second phase to the interface surfaces of the electronic component and thermal dissipation member. The material has a transition temperature from the first phase to the second phase which is within the operating temperature range of the electronic component.

Advantages of the present invention include a thermal interface material which melts of softens to better conform to the interfaces surfaces, but which is self-supporting and form-stable at room temperature for ease of handling and application. Further advantages include an interface material which may be formed into a film or tape without a web or other supporting substrate, and which may be applied using automated methods to, for example, the interface surface of a thermal dissipation member. Such member then may be shipped to a manufacturer for direct installation into a circuit board to thereby obviate the need for hand lay-up of the interface material. Still further advantages include a thermal interface formulation which may be tailored to provide controlled thermal and viscometric properties. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

DETAILED DESCRIPTION OF THE INVENTION

Figure 1:
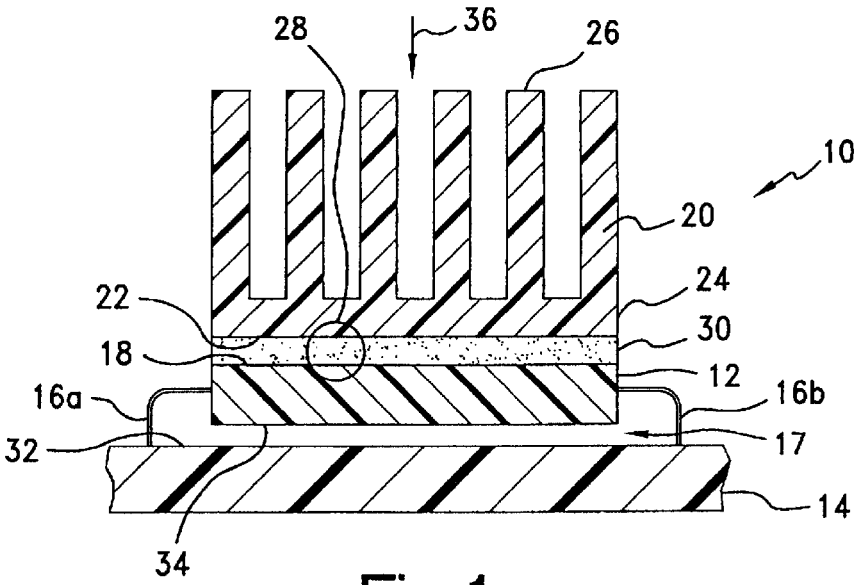
FIG. 1 is a fragmentary, cross-sectional view of an electrical assembly wherein a heatgenerating electronic component thereof is conductively cooled in accordance with the present invention via the provision of an interlayer of a thermally-conductive material within the thermal interace between the heat transfer surfaces of the component and an associated thermal dissipation member.

Referring to the drawings wherein corresponding reference characters indicate corresponding elements throughout the figures, shown generally at 10 in FIG. 1 is an electrical assembly which includes a heat-generating digital or analog electronic component 12, supported on an associated printed circuit board (PCB) or other substrate, 14. Electrical component 12 may be an integrated microchip, microprocessor, transistor, or other semiconductor, or an ohmic or other heat-generating subassembly such as a diode, relay, resistor, transformer, amplifier diac, or capacitor. Typically, component 12 will have an operating temperature range of from about 60–80° C. For the electrical connection of component 12 to board 14, a pair of leads or pins, 16a and 16b, are provided as extending from either end of component 12 into a soldered or other connection with board 14. Leads 16 additionally may support component 12 above board 14 to define a gap, represented at 17, of about 3 mils (75 microns) therebetween. Alternatively, component 12 may be received directly on board 14.

As supported on board 14, electronic component 12 presents a first heat transfer surface, 18, which is disposable in a thermal, spaced-apart adjacency with a corresponding second heat transfer surface, 22, of an associated thermal dissipation member, 20. Dissipation member 20 is constructed of a metal material or the like having a heat capacity relative to that of component 12 to be effective is dissipating thermal energy conducted or otherwise transferred therefrom. For purposes of the present illustration, thermal dissipation member 20 is shown as a heat sink having a generally planar base portion, 24, from which extends a plurality of cooling fins, one of which is referenced at 26. With assembly 10 configured as shown, fins 26 assist in the convective cooling of component 12, but alternatively may be received within an associated cold plate or the like, not shown, for further conductive dissipation of the thermal energy transferred from component 12.

The disposition of first heat transfer surface 18 of electronic component 12 in thermal adjacency with second heat transfer surface 22 of dissipation member 20 defines a thermal interface, represented at 28, therebetween. A thermally-conductive interlayer, 30, is interposed within interface 28 between heat transfer surfaces 18 and 22 for providing a conductive path therethrough for the transfer of thermal energy from component 12 to dissipation member 20. Such path may be employed without or in conjunction with convective air circulation for effecting the cooling of component 12 and ensuring that the operating temperature thereof is maintained below specified limits.

Although thermal dissipation member 20 is shown to be a separate heat sink member, board 14 itself may be used for such purpose by alternatively interposing interlayer 30 between surface 32 thereof and corresponding surface 34 of electronic component 12. In either arrangement, a clip, spring, or clamp or the like (not shown) additionally may be provided for applying an external force, represented at 32, of from about 1–2 $lbs_f$ for improving the interface area contact between interlayer 30 and surfaces 18 and 22 or 32 and 34.

In accordance with the precepts of the present invention, interlayer 30 is formed of a self-supporting film, sheet, or other layer of a thermally-conductive material. By "self-supporting," it is meant that interlayer 30 is free-standing without the support of a web or substrate which would introduce another layer into the thermal interface between air pockets could be formed. Typically, the film or sheet of interlayer 30 will have a thickness of from about 1–10 mils (25–250 microns) depending upon the particular geometry of assembly 10.

The thermally-conductive material forming interlayer 30 is formulated to be form-stable at normal room temperature, i.e., about 25° C., in a first phase, which is solid, semi-solid, glassy, or crystalline, but to be substantially conformable in a second phase, which is a liquid, semi-liquid, or otherwise viscous melt, to interface surfaces 18 and 22 of, respectively, electronic component 12 and thermal dissipation member 20. The transition temperature of the material, which may be its melting or glass transition temperature, is preferably from about 60 or 70° C. to about 80° C., and is tailored to fall within the operating temperature of electronic component 12.

Figure 2:
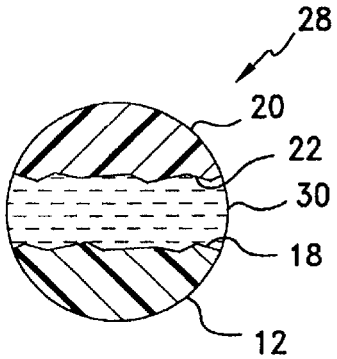
FIG. 2 is a view of a portion of the thermal interface of FIG. 1 which is enlarged to detail the morphology thereof.

Further in this regard, reference may be had to FIG. 2 wherein an enlarged view of a portion of interface 28 is illustrated to detail the internal morphology thereof during the enerigization of electronic component 12 effective to heat interlayer 30 to a temperature which is above its phase transition temperature. Interlayer 30 accordingly is shown to have been melted or otherwise softened from a form-stable solid or semi-solid phase into a flowable or otherwise conformable liquid or semi-liquid viscous phase which may exhibit relative intermolecular chain movement. Such viscous phase provides increased surface area contact with interface surfaces 18 and 22, and substantially completely fills interface 28 via the exclusion of air pockets or other voids therefrom to thereby improve both the efficiency and the rate of heat transfer through interface. Moreover, as depending on, for example, the melt flow index or viscosity of interlayer 30 and the magnitude of any applied external pressure 36 (FIG. 1), the interface gap between surfaces 18 and 22 may be narrowed to further improve the efficiency of the thermal transfer therebetween. Any latent heat associated with the phase change of the material forming interlayer 30 additionally contributes to the cooling of component 12.

Figure 3:
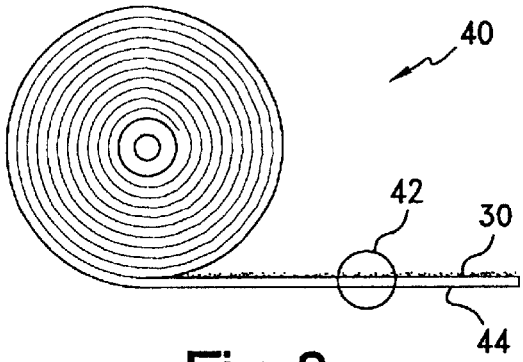
FIG. 3 is a cross-sectional end view which shows the thermally-conductive material of FIG. 1 as coated as a film layer onto a surface of a release sheet, which sheet is rolled to facilitate the dispensing of the film.
Figure 4:
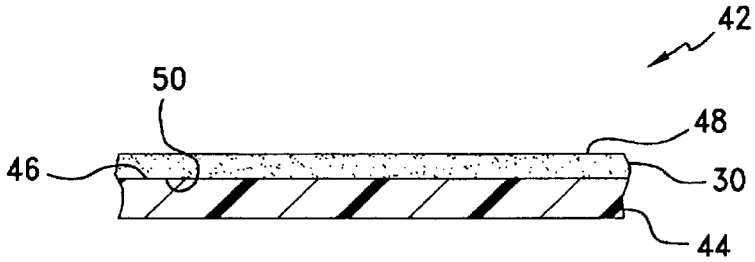
FIG. 4 is a view of a portion of the film and release sheet roll of FIG. 3 which is enlarged to detail the structure thereof The drawings will be described further in connection with the following Detailed Description of the Invention.

Unlike the greases or waxes of such type heretofore known in the art, however, interlayer of the present invention advantageously is form-stable and self-supporting at room temperature. Accordingly, and as is shown generally at 40 in FIG. 3, interlayer 30 advantageously may be provided in a rolled, tape form to facilitate its application to the substrate by an automated process. As may be better appreciated with additional reference to FIG. 4 wherein a portion, 42, of tape 40 is shown in enhanced detail, tape 40 may be formed by applying a film of interlayer 30 to a length of face stock, liner, or other release sheet, 44. Interlayer 30 may be applied to a surface, 46, of release sheet 44 in a conventional manner, for example, by a direct process such as spraying, knife coating, roller coating, casting, drum coating, dipping, or like, or an indirect transfer process utilizing a silicon release sheet. A solvent, diluent, or other vehicle may be provided to lower the viscosity of the material forming interlayer 30. After the material has been applied, the release sheet may be dried to flash the solvent and leave an adherent, tack-free film, coating, or other residue of the material thereon.

As is common in the adhesive art, release sheet 44 may be provided as a strip of a waxed, siliconized, or other coated paper or plastic sheet or the like having a relatively low surface energy so as to be removable without appreciable lifting of interlayer 30 from the substrate to which it is ultimately applied. Representative release sheets include face stocks or other films of plasticized polyvinyl chloride, polyesters, cellulosics, metal foils, composites, and the like.

In the preferred embodiment illustrated, tape 40 may be sectioned to length, and the exposed surface, 48, of interlayer 30 may be applied to interface surface 22 of dissipation member 20 (FIG. 1) prior to its installation in assembly 10. In this regard, interlayer exposed surface 48 may be provided as coated with a thin film of a pressure sensitive adhesive or the like for adhering interlayer 30 to dissipation member 20. Alternatively, interface surface 22 of dissipation member 20 may be heated to melt a boundary layer of interlayer surface 48 for its attachment via a "hot-melt" mechanism.

With tape 40 so applied and with release sheet 44 protecting the unexposed surface, 50, of interlayer 30, dissipation member 20 (FIG. 1) may be packaged and shipped as an integrated unit to an electronics manufacturer, assembler, or other user. The user then simply may remove release sheet 44 to expose surface 50 of interlayer 30, position surface 50 on heat transfer surface 18 of electronic component 12, and lastly apply a clip or other another means of external pressure to dispose interlayer surface 50 in an abutting, heat transfer contact or other thermal adjacency with electronic component surface 18.

In one preferred embodiment, interlayer 30 is formulated as a form-stable blend of: (a) from about 25 to 50% by weight of a pressure sensitive adhesive (PSA) component having a melting temperature of from about 90–100° C.; (b) from about 50 to 75% by weight of an α-olefinic, thermoplastic component having a melting temperature of from about 50–60° C.; and (c) from about 20 to 80% by weight of one or more thermally-conductive fillers. "Melting temperature" is used herein in its broadest sense to include a temperature or temperature range evidencing a transition from a form-stable solid, semi-solid, crystalline, or glassy phase to a flowable liquid, semi-liquid, or otherwise viscous phase or melt which may be characterized as exhibiting intermolecular chain rotation.

The PSA component generally may be of an acrylic-based, hot-melt variety such as a homopolymer, copolymer, terpolymer, interpenetrating network, or blend of an acrylic or (meth)acrylic acid, an acrylate such as butyl acrylate, and/or an amide such as acrylamide. The term "PSA" is used herein in its conventional sense to mean that the component is formulated has having a glass transition temperature, surface energy, and other properties such that it exhibits some degree of tack at normal room temperature. Acrylic hot-melt PSAs of such type are marketed commercially by Heartland Adhesives, Germantown, Wis., under the trade designations "H600" and "H251."

The α-olefinic thermoplastic component preferably is a polyolefin which may be characterized as a "low melt" composition. A representative material of the preferred type is an amorphous polymer of a $C_{10}$ or higher alkene which is marketed commercially by Petrolite Corporation, Tulsa, Okla., under the trade designation "Vybar® 260." Such material may be further characterized as is set forth in Table 1.

TABLE 1

Physical Properties of Representative Olefinic Polymer Component (Vybar ® 260)

| | |
|---|---|
| Molecular Weight | 2600 g/mol |
| Melting Point (ASTM D 36) | 130° F. (54° C.) |
| Viscosity (ASTM D 3236) @ 210° F. (99° C.) | 357.5 cP |
| Penetration (ASTM D 1321) @ 77° F. (25° C.) | 12 mm |
| Density (ASTM D 1168) | |
| @ 75° F. (24° C.) | 0.90 g/cm$^3$ |
| @ 200° F. (93° C.) | 0.79 g/cm$^3$ |
| Iodine Number (ASTM D 1959) | 15 |

By varying the ratio within the specified limits of the PSA to the thermoplastic component, the thermal and viscometric properties of the interlayer formulation may be tailored to provide controlled thermal and viscometric properties. In particular, the phase transition temperature and melt flow index or viscosity of the formulation may be selected for optimum thermal performance with respect to such variables as the operating temperature of the heat generating electronic component, the magnitude of any applied external pressure, and the configuration of the interface.

In an alternative embodiment, a paraffinic wax or other natural or synthetic ester of a long-chain ($C_{16}$ or greater) carboxylic acid and alcohol having a melting temperature of from about 60–70° C. may be substituted for the thermoplastic and PSA components to comprise about 20–80% by weight of the formulation. A preferred wax is marketed commercially by Bareco Products of Rock Hill, S.C. under the trade designation "Ultraflex® Amber," and is compounded as a blend of clay-treated microcrystalline and amorphous constituents. Such wax is additionally characterized in Table 2 which follows.

TABLE 2

Physical Properties of Representative Paraffinic Wax Component (Ultraflex ® Amber)

| | |
|---|---|
| Melting Point (ASTM D 127) | 156° F. (69° C.) |
| Viscosity (ASTM D 3236) @ 210° F. (99° C.) | 13 cP |
| Penetration (ASTM D 1321) | |
| @ 77° F. (25° C.) | 29 mm |
| @ 110° F. (43° C.) | 190 mm |
| Density (ASTM D 1168) | |
| @ 75° F. (25° C.) | 0.92 g/cm$^3$ |
| @ 210° F. (99° C.) | 0.79 g/cm$^3$ |

In either of the described embodiments, the resin or wax components form a binder into which the thermally-conductive filler is dispersed. The filler is included within the binder in a proportion sufficient to provide the thermal conductivity desired for the intended application. The size and shape of the filler is not critical for the purposes of the present invention. In this regard, the filler may be of any general shape including spherical, flake, platelet, irregular, or fibrous, such as chopped or milled fibers, but preferably will be a powder or other particulate to assure uniform dispersal and homogeneous mechanical and thermal properties. The particle size or distribution of the filler typically will range from between about 0.25–250 microns (0.01–10 mils), but may further vary depending upon the thickness of interface 28 and/or interlayer 30.

It additionally is preferred that the filler is selected as being electrically-nonconductive such that interlayer 30 may provide an electrically-insulating but thermally-conductive barrier between electronic component 12 and thermal dissipation member 20. Suitable thermally-conductive, electrically insulating fillers include boron nitride, alumina, aluminum oxide, aluminum nitride, magnesium oxide, zinc oxide, silicon carbide, beryllium oxide, and mixtures thereof Such fillers characteristically exhibit a thermal conductivity of about 25–50 W/m-°K.

Additional fillers and additives may be included in interlayer 30 to the extent that the thermal conductivity and other physical properties thereof are not overly compromised. As aforementioned, a solvent or other diluent may be employed during compounding to lower the viscosity of the material for improved mixing and delivery. Conventional wetting opacifying, or anti-foaming agents, pigments, flame retardants, and antioxidants also may be added to the formulation depending upon the requirements of the particular application envisioned. The formulation may be compounded in a conventional mixing apparatus.

Although not required, a carrier or reinforcement member (not shown) optionally may be incorporated within interlayer 30 as a separate internal layer. Conventionally, such member may be provided as a film formed of a thermoplastic material such as a polyimide, or as a layer of a woven fiberglass fabric or an expanded aluminum mesh. The reinforcement further supports the interlayer to facilitate its handling at higher ambient temperatures and its die cutting into a variety of geometries.

The Example to follow, wherein all percentages and proportions are by weight unless otherwise expressly indicated, is illustrative of the practicing of the invention herein involved, but should not be construed in any limiting sense.

EXAMPLE

Master batches representative of the interlayer formulations of the present invention were compounded for characterization according to the following schedule:

TABLE 3

Representative Interlayer Formulations

| Sample No. | Vybar ® 260[1] (wt. %) | H600[2] (wt. %) | Ultraflex ® Amber[3] (wt. %) | Filler (wt. %) Bn[4] | $ZnO_2$[5] | Al[6] |
|---|---|---|---|---|---|---|
| 3-1 | 45 | 22 | | | | 33 |
| 3-2 | 47 | 17 | | | | 36 |
| 3-3 | 47 | 17 | | 6 | | 30 |
| 3-6 | | | 40 | | | 60 |
| 3-7 | 40 | 19 | | | 41 | |
| 3-8 | 50 | 25 | | 25 | | |
| 3-10 | 34 | 16 | | | 50 | |
| 5-1 | | | 67 | 33 | | |

[1]α-olefinic thermoplastic, Petrolite Corp., Tulsa, OK
[2]acrylic PSA, Heartland Adhesives, Germantown, WI
[3]paraffinic wax, Bareco Products Corp. Rock Hill, SC
[4]Boron nitride, HCP particle grade, Advanced Ceramics, Cleveland, OH
[5]Zinc oxide, Midwest Zinc, Chicago, IL; Wittaker, Clark & Daniels, Inc., S. Plainfield, NJ
[6]Alumina, R1298, Alcan Aluminum, Union, NJ The Samples were thinned to about 30–70% total solids with toluene or xylene, cast, and then dried to a film thickness of from about 2.5 to 6 mils. When heated to a temperature of between about 55–65° C., the Samples were observed to exhibit a conformable grease or paste-like consistency. The following thermal properties were measured and compared with conventional silicone grease (Dow 340, Dow Corning, Midland, Mich.) and metal foil-supported wax (Crayotherm™, Crayotherm Corp., Anaheim, Calif.) formulations:

TABLE 4

Thermal Properties of Representative and Comparative Interlayer Formulations

| Sample No. | Formulation | Filler (wt. %) | Thickness (mills) | Thermal Impedance[5] (° C.-in/w) | Thermal Conductivity[5] (w/m-° K.) |
|---|---|---|---|---|---|
| 3-1 | blend | 62% Al | 6 | 0.14 | 1.7 |
| 3-2 | blend | 62% Al | 4 | 0.12 | 1.3 |
| 3-3 | blend | 62% Al/BN | 4 | 0.09 | 1.7 |

TABLE 4-continued

Thermal Properties of Representative and Comparative Interlayer Formulations

| Sample No. | Formulation | Filler (wt. %) | Thickness (mills) | Thermal Impedance[5] (° C.-in/w) | Thermal Conductivity[5] (w/m-° K.) |
|---|---|---|---|---|---|
| 3-6 | wax[2] | 60% Al | 2.5 | 0.04 | 2.3 |
| 5-1 | wax | 50% BN | 4 | 0.10 | 1.5 |
| 3-7 | blend | 62% $ZnO_2$ | 4 | 0.14 | 1.1 |
| 3-8 | blend | 30% BN | 2.5 | 0.07 | 1.5 |
| 3-10 | blend | 70% $ZnO_2$ | 3 | 0.12 | 0.95 |
| Crayotherm | wax/foil[3] | $ZnO_2$ | 2.5 | 0.11 | 0.93 |
| 3-2 | blend | 62% Al | 5 | 0.26 | 0.74 |
| 3-6 | wax | 60% Al | 5 | 0.30 | 0.65 |
| 5-1 | wax | 50% BN | 5 | 0.12 | 1.64 |
| Dow 340 | grease[4] | $ZnO_2$ | 5 (true[6]) | 0.36 | 0.54 |

[1]blend of Vybar ® and H600
[2]Ultraflex ® Amber
[3]metal foil-supported wax
[4]silicone grease
[5]measured using from about 10-300 psi applied external pressure
[6]spacers used to control thickness The foregoing results confirm that the interlayer formulations of the present invention retain the preferred conformal and thermal properties of the greases and waxes heretofore known in the art. However, such formulations additionally are form-stable and self-supporting at room temperature, thus affording easier handling and application and obviating the necessity for a supporting substrate, web, or other carrier.

As it is anticipated that certain changes may be made in the present invention without departing from the precepts herein involved, it is intended that all matter contained in the foregoing description shall be interpreted as illustrative and not in a limiting sense. All references cited herein are expressly incorporated by reference.

What is claimed:

[1. A method of conductively cooling a heat-generating electronic component having an operating temperature range above normal room temperature and a first heat transfer surface disposable in thermal adjacency with a second heat transfer surface of a thermal dissipation member to define an interface therebetween, said method comprising the steps of:

(a) providing a thermally-conductive material which is form-stable at normal room temperature in a first phase and conformable in a second phase to substantially fill said interface, said material having a transition temperature from said first phase to said second phase within the operating temperature range of said electronic component, and said material consisting essentially of at least one resin or wax component blended with at least one thermally-conductive filler;

(b) forming said material into a self-supporting and free-standing film layer, said layer consisting essentially of said material and having a thickness of from about 1–10 mils;

(c) applying said layer to one of said heat transfer surfaces;

(d) disposing said heat transfer surfaces in thermal adjacency to define said interface; and (e) energizing said electronic component effective to heat said layer to a temperature which is above said phase transition temperature.]

[2. The method of claim 1 further comprising an additional step between steps (d) and (e) of applying an external force to at least one of said heat transfers defining said interface.]

[3. The method of claim 1 wherein said thermal dissipation member is a heat sink or a circuit board.]

[4. The method of claim 1 wherein said layer is applied in step (c) to the heat transfer surface of said electronic component.]

[5. The method of claim 1 wherein said self-supporting layer is formed in step (b) by coating a film of said material onto a surface of a release sheet, and wherein said layer is applied in step (c) by adhering said film to one of said heat transfer and removing said release sheet to expose said film.]

[6. The method of claim 1 wherein said material is provided in step (a) as consisting essentially of a blend of:

(i) from about 20 to 80% by weight of a paraffinic wax component having a melting temperature of from about 60–70° C.; and (ii) from about 20 to 80% by weight of one or more thermally-conductive fillers.]

[7. The method of claim 6 wherein said material has a phase transition temperature of from about 60–80° C.]

[8. The method of claim 6 wherein said one or more thermally-conductive fillers is selected from the group consisting of boron nitride, alumina, aluminum oxide, aluminum nitride, magnesium oxide, zinc oxide, silicon carbide, beryllium oxide, and mixtures thereof.]

[9. A thermally-conductive interface for interposition between a heat-generating electronic component having an operating temperature range above normal room temperature and a first heat transfer surface disposable in thermal adjacency with a second heat transfer surface of a thermal dissipation member, said interface comprising a self-supporting and free-standing film layer having a thickness of from about 1–10 mils and consisting essentially of a thermally-conductive material which is form-stable at normal room temperature in a first phase and substantially conformable in a second phase to said interface surfaces, said material having a transition temperature from said first phase to said second phase within the operating temperature range of said electronic component, and said material consisting essentially of at least one resin or wax component blended with at least one thermally-conductive filler.]

[10. The interface of claim 9 which is coated as a film onto a surface of a release sheet.]

[11. The interface of claim 9 wherein said material consisting essentially of a blend of:

(a) from about 20 to 80% by weight of a paraffinic wax component having a melting temperature of from about 60–70° C.; and (b) from about 20 to 80% by weight of one or more thermally-conductive fillers.]

[12. The interface of claim 11 wherein said material has a phase transition temperature of from about 60–80° C.]

[13. The interface of claim 11 wherein said one or more thermally-conductive fillers is selected from the group consisting of boron nitride, alumina, aluminum oxide, aluminum nitride, magnesium oxide, zinc oxide, silicon carbide, beryllium oxide, and mixtures thereof.]

14. A method of conductively cooling a heat-generating electronic component having an operating temperature range above normal room temperature and a first heat transfer surface disposable in thermal adjacency with a second heat transfer surface of a thermal dissipation member to define an interface therebetween, said method comprising the steps of:

(a) providing a thermally-conductive material which is form-stable at normal room temperature in a first phase and conformable in a second phase to substantially fill said interface, said material having a transition temperature from said first phase to said second phase within the operating temperature range of said electronic component and comprising a blend of:

(i) from about 25 to 50% by weight of an acrylic pressure sensitive adhesive component having a melting temperature of from about 90–100° C.;

(ii) from about 50 to 75% by weight of an α-olefinic, thermoplastic component having a melting temperature of from about 50–60° C.; and (iii) from about 20 to 80% by weight of one or more thermally-conductive fillers;

(b) forming said material into a self-supporting layer;

(c) applying said layer to one of said heat transfer surfaces;

(d) disposing said heat transfer surfaces in thermal adjacency to define said interface; and (e) energizing said electronic component effective to heat said layer to a temperature which is above said phase transition temperature.

15. The method of claim 14 wherein said material has a phase transition temperature of from about 70–80° C.

16. The method of claim 14 wherein said one or more thermally-conductive fillers is selected from the group consisting of boron nitride, alumina, aluminum oxide, aluminum nitride, magnesium oxide, zinc oxide, silicon carbide, beryllium oxide, and mixtures thereof.

17. A thermally-conductive interface for interposition between a heat-generating electronic component having an operating temperature range above normal room temperature and a first heat transfer surface disposal in thermal adjacency with a second heat transfer surface of a thermal dissipation member, said interface comprising a self-supporting layer of a thermally-conductive material which is form-stable at normal room temperature in a first phase and substantially conformable in a second phase to said interface surfaces, said material having a transition temperature from said first phase to said second phase within the operating temperature range of said electronic component, and comprising a blend of:

(a) from about 25 to 50% by weight of an acrylic pressure sensitive adhesive component having a melting temperature of from about 90–100° C.;

(b) from about 50 to 75% by weight of an α-olefinic, thermoplastic component having a melting temperature of from about 50–60° C.; and (c) from about 20 to 80% by weight of one or more thermally-conductive fillers.

18. The interface of claim 17 wherein said material has a phase transition temperature of from about 70–80° C.

19. The interface of claim 17 wherein said one or more thermally-conductive fillers is selected from the group consisting of boron nitride, alumina, aluminum oxide, aluminum nitride, magnesium oxide, zinc oxide, silicon carbide, beryllium oxide, and mixtures thereof.

* * * * *